United States Patent [19] [11] 4,384,253
Förster [45] May 17, 1983

[54] MEANS FOR ACHIEVING PARALLELISM OF THE MAGNETIC AXES OF A DIFFERENTIAL MAGNETIC FIELD PROBE

[76] Inventor: Friedrich M. O. Förster, In Laisen 70, D-7410 Reutlingen 1, Fed. Rep. of Germany

[21] Appl. No.: 191,172

[22] Filed: Sep. 26, 1980

[30] Foreign Application Priority Data

Oct. 24, 1979 [DE] Fed. Rep. of Germany ....... 2942847

[51] Int. Cl.³ .......................................... G01R 33/022
[52] U.S. Cl. .................................... 324/244; 324/245; 324/253
[58] Field of Search ............... 324/244, 245, 253, 254, 324/154

[56] References Cited

U.S. PATENT DOCUMENTS

| 2,710,376 | 6/1955 | Sias | 324/154 R X |
| 3,281,683 | 10/1966 | Stefansson et al. | 324/154 R X |
| 3,439,264 | 4/1969 | Schonstedt | 324/254 X |
| 3,538,428 | 11/1970 | Barringer | 324/330 |
| 3,736,502 | 5/1973 | Schonstedt | 324/253 |
| 3,961,245 | 6/1976 | Schonstedt | 324/245 |
| 3,982,179 | 9/1976 | Forster | 324/245 |
| 4,110,689 | 8/1978 | Schonstedt | 324/254 |

Primary Examiner—Gerard R. Strecker
Attorney, Agent, or Firm—George J. Netter

[57] ABSTRACT

A magnetic field differential probe has field sensors located at spaced intervals along a tensilely stressed diamagnetic wire free of mechanical support between the sensors.

17 Claims, 8 Drawing Figures

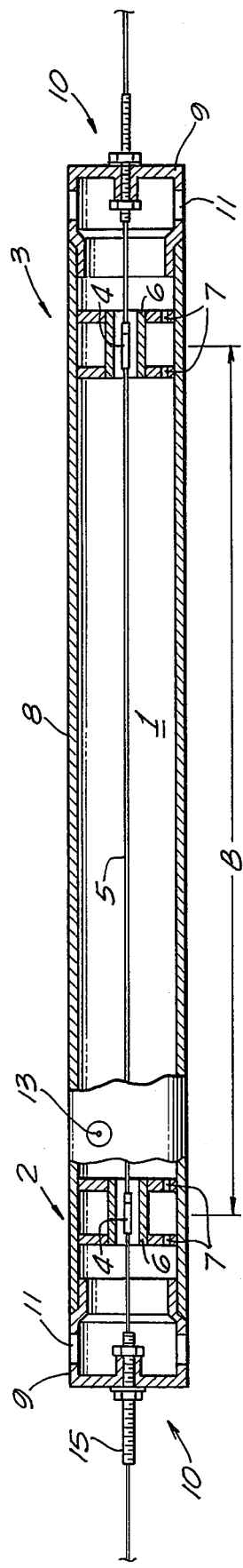
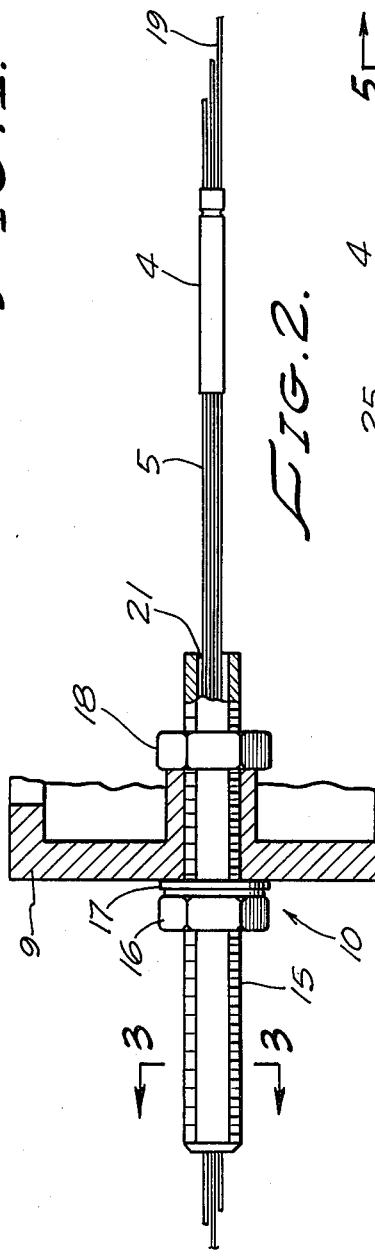
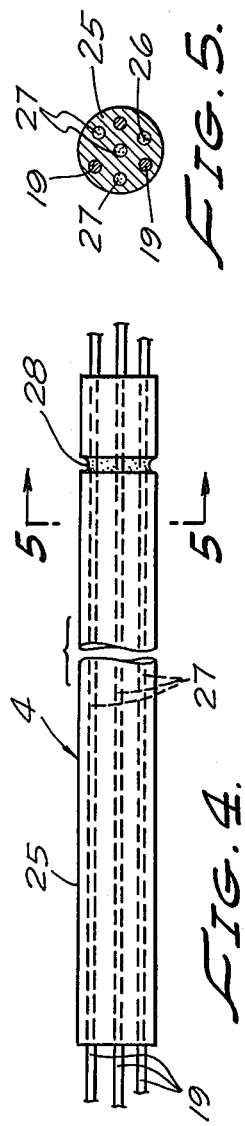
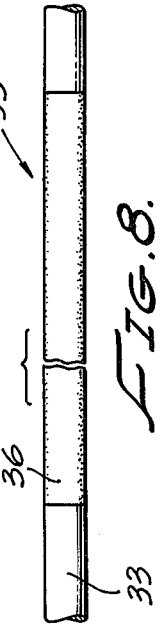
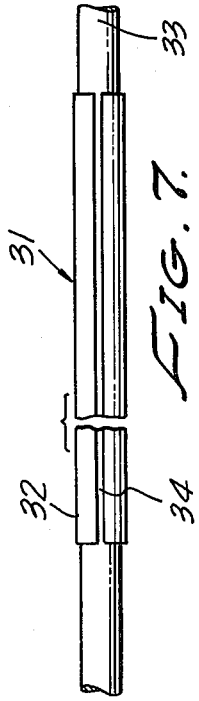

MEANS FOR ACHIEVING PARALLELISM OF THE MAGNETIC AXES OF A DIFFERENTIAL MAGNETIC FIELD PROBE

The present invention relates generally to a magnetic field differential probe and, more particularly, to such a differential probe the parts of which can be quickly and accurately adjusted into parallelism for use.

BACKGROUND OF THE INVENTION

Differential probes are primarily used for detecting ferromagnetic bodies hidden in the earth or in water, such as bombs, mines, ships, ship parts or the like. Such bodies are located by evaluating the disturbance caused by such bodies of the otherwise homogeneous magnetic field of the earth, i.e., the earth field gradient. In many cases, harmonic-wave magnetic field sensors are used for this purpose in which the transducer consists of a soft-magnetic core element of high magnetic permeability. The core is magnetized to full saturation by a magnetic alternating field of a given frequency. An external magnetic field occurring in the direction of the core element results in a dissymmetry of the magnetization characteristic of the core element thereby producing in the winding surrounding the core element an electric voltage of an amplitude proportional to the field strength of the external magnetic field and of a frequency consisting in an even-numbered harmonic wave of the frequency of the exciting alternating field. Although it is true that harmonic wave magnetic field probes are useful for this purpose, other magnetic field sensors may on principle also be used in a differential probe, and, in particular, in so-called search instruments.

Frequently, the above-mentioned differential probes must resolve magnetic field differences in the range of $1 \times 10^{-9}$ Tesla (1 nano Tesla), while under the influence of a field strength of 50,000 nano Tesla. In the case of a search device, this may for instance be the influence of the magnetic earth field. However, this means that exacting demands must be placed on the parallelism of the magnetic axes of the magnetic field sensors used in relation to each other and also in relation to an imagined straight line for the entire probe; otherwise, a difference in the magnetic fields could be falsely indicated in the case of a rotation of the differential probe about its longitudinal axis, for example. The angular deviation from parallelism would have to be kept below 4 seconds of arc, i.e., $2 \times 10^{-5}$ radians.

In search applications, the sensitivity of the differential probe increases as the base distance between the magnetic field sensors increases. The upper limit of the base distance is determined by the temperature and aging effects provoking a maladjustment of the parallelism of the magnetic axis of the sensors. Presently, this upper limit is approximately 0.5 meters.

A magnetic field differential probe of the general type referenced above is set forth in U.S. Pat. No. 3,982,179. The differential probe of this patent has each magnetic core element fastened onto two stretched wires extending at a specified distance and parallel to each other. One end of the wires is provided with means for maintaining the parallelism which enables the exact adjustment of the parallelism of the magnetic core element in two planes vertical to each other. The two wires are generally part of a continuous wire formed by a return means into a U-shaped loop and maintained under mechanical tension by a spring.

As compared to differential probes formerly used, the probe of this patent offers a considerable advantage. While the former differential probes had their magnetic field sensors installed in the upper and lower ends, respectively, of a probe tube so that any distortion of the probe tube provoked a notable maladjustment of the parallelism of the magnetic axes, this error source is eliminated.

However, there still remain other possible detrimental effects upon the parallelism which are important. Different degrees of extension of the material of the return means and the material between the points where the free ends of the U-shaped wire loop are clamped, lead to non-parallelism. The same applies even more to a possible rotation of the return means about the longitudinal axis of the differential probe. Such a rotation for a given angle causes the two ends of the wires in the return means to be dislocated in opposite senses, and this, in turn, results in a deviation from parallelism which is greater the larger the diameter of the return means becomes. The only way to avoid this latter error is to provide a correspondingly sturdy and weighty design of the return means, but this necessarily renders handling more difficult and increases cost. The means for maintaining the parallelism, which necessarily must be constructed to cover a relatively wide range of adjustment, constitute an additional risk of changes from parallelism due to temperature influences and shocks. Still further, the two means for maintaining parallelism require finely adjustable slides with carefully finished guide faces, which renders them rather expensive. If the deviation from parallelism produced by the gravity forces resulting from the slack of the two wires when the differential probe is in the horizontal position, is to be kept within narrow limits, the tension must be very high. But the high tension, in turn, means that the tension forces in the two wires must be well balanced by the use of a freely turning return roller, for example. However, in this case the shock-proof suspension of the roller can be achieved only at great cost. The desire to reduce the slack of the wires leads to the use of materials for the latter which combine the properties of light weight, low extension and strength. However, as such materials are rather brittle, they require a wide radius of curvature, and this, in turn, leads to undesirably large diameters for the return means.

OBJECTS AND SUMMARY OF THE INVENTION

It is therefore an object of the present invention to provide a differential probe in which probe core parallelism achieved during production is already such that the necessity of readjustment is either completely avoided or reduced to a minimum, and in which the parallelism is resistant to shocks and temperature influences even when base distances are relatively great.

In the practice of the present invention, the probe magnetic core elements determining the magnetic axes of the magnetic field sensors are mounted on one continuous wire arrangement which is stretched between two end points and completely unsupported between the magnetic core elements. With the wire arrangement tensioned, the deviation from parallelism of the magnetic core element depends only on two factors, namely, the slack in the wire arrangement caused by gravity, and the deviation in parallelism between the magnetic core elements and the axis of the wire arrangement at the point where the magnetic core elements are mounted. By optimal selection of the wire material, the deviation from parallelism caused by the slack can be maintained within very narrow limits, at least if only the magnetic core elements themselves are supported on the wire arrangement. With the probe maintained substantially vertically, which is the normal position for search devices, the deviation caused by the slack is of minor importance. As will be shown hereafter, the suspension of the magnetic core elements on the wire arrangement can be carried out so that in many cases the need for subsequent adjustments is completely eliminated. In any case, however, the range necessary for adjusting the parallelism is extremely reduced so that means for maintaining the parallelism can be used which are not suitable for larger ranges, such as the so-called magnetic method which permits the non-contact complete compensation of the remaining minor deviations from parallelism.

According to the magnetic method, a balancing body extending vertically in relation to the probe magnetic core element and consisting of a strip or pin of a highly permeable soft-magnetic material, is brought near to the magnetic core element so that the magnetic axis of the latter tilts towards the balancing element. This method is described in U.S. Pat. No. 3,487,459. However, in practice, it has not been possible to replace the mechanical method of balancing the parallelism with the magnetic method of balancing the parallelism. As it is absolutely necessary in differential probes that the properties of the individual sensors exactly conform, it proved to be disadvantageous that apart from a rising non-linearity of the sensor in response to the degree of tilting of the magnetic axis, the sensitivity of a sensor should vary directly in response to the approach of the strip or pin used as balancing element. In addition, there existed the risk in the case of relatively large balancing elements, which also had to be finely adjusted, of disturbances due to residual magnetism induced by the relatively strong magnetic fields.

Because of the very small deviations from parallelism to be balanced in the case of the differential probe of the invention, very small balancing elements or correspondingly large distances from the magnetic core element will suffice to restore the parallelism. Accordingly, the above-mentioned undesirable secondary effects are safely excluded so that in the case of the differential probe of the invention the mechanical method of balancing the parallelism may, if necessary, be completely replaced by the magnetic method of balancing the parallelism. Another advantage can be seen in the elimination of any special spring arrangement for tensioning the supporting wires.

Still further, as compared to the differential probes heretofore known, the differential probe of the invention is of simpler design, reduces considerably the production cost, achieves an extraordinary stability of core parallelism and eliminates the need for maintenance. In addition, the invention permits the construction of a differential probe with a base distance of 2 meters without sacrificing any of the desirable features of operation.

DESCRIPTION OF THE DRAWING

FIG. 1 shows an elevational, partially sectional view of a differential probe in accordance with the invention.

FIG. 2 is an enlarged sectional view of an end portion of the differential probe.

FIG. 3 is a sectional view taken long the line 3—3 of FIG. 2.

FIG. 4 is an elevational, partially fragmentary view of a magnetic core element.

FIG. 5 is a sectional view taken along the line 5—5 of FIG. 4.

FIG. 6 is an elevational view of a balancing element.

FIGS. 7 and 8 show other magnetic core elements.

DESCRIPTION OF A PREFERRED EMBODIMENT

The differential probe 1 shown in FIG. 1 includes two harmonic wave, magnetic field sensors 2 and 3 connected in a general manner known for producing a signal to an evaluation means (not shown), which signal corresponds to the magnetic field difference existing between the two sensors 2 and 3, the base distance being identified as B. The two sensors 2 and 3, which are of exactly identical design, each include as an essential component magnetic core elements 4 which determine the magnetic axes of the two sensors. The magnetic core elements 4 are mounted in a manner to be described on a wire arrangement 5 so that their orientation conforms very exactly to that of the wire arrangement 5. Coil sets 6 serve both to build up magnetic alternating fields magnetizing the magnetic core elements 4 to saturation, and to receive a signal voltage corresponding to the magnetic field strength. The coil sets 6 are mounted by means of supporting rings 7 on the inside of a probe tube 8 which, in turn, may be mounted in a suitable carrier tube (not shown).

Instead of the sensor arrangement shown here, each of the two sensors 2 and 3 may alternatively include a pair of coil sets 6 and magnetic core elements 4. In this case, the two coil sets and core elements belonging to one sensor are arranged adjacent each other in the longitudinal direction of the diferential probe, and the two core elements are fastened to the wire 5 in series.

The probe tube 8 is closed on both ends by caps 9 provided with means 10 for stretching the wire arrangement 5. The means 10 are illustrated in more detail in FIG. 2, and are seen to have a threaded tube 15, a tightening nut 16, a washer 17 and a check-nut 18. Openings 11 in the shell of the cap 9 provide access to the check-nut 18 when the cap 9 is applied. Secured into the bore of the threaded tube 15 is the wire arrangement 5 consisting of three individual wires 19 arranged in parallel contacting relation. The threaded tube 15 may be provided on two sides with flat portions 20 which can be best seen in the sectional view of FIG. 3, the flat portions serving to retain the threaded tube 15 against the rotation when the nut 16 is tightened for the purpose of stretching the wire arrangement 5. To this end, the flat portions can be either simply retained by means of a wrench or else retained against rotation in the bore of the cap 9.

The material of the wire arrangement 5 must have certain exacting physical characteristics. First, its specific gravity should be low so that on the one hand the slack caused by the gravity forces are kept within narrow limits and, on the other hand, the forces and vibrations occasioned by shocks will be as small as possible and be quickly dissipated. The tensile strength should be high so as to permit efficient stretching of the wire arrangement 5, while still maintaining a sufficiently large safety margin to the breaking stress. Of course, only a diamagnetic material can be used. Good results have been obtained with a tungsten wire and with a boron fiber, the latter being produced by precipitating elemental boron upon a tungsten wire of 10 micrometers thickness. The difficulty in processing relatively brittle boron fibers is largely made up for by the fact that their specific gravity is approximately ten times lower than tungsten, although the tensile strength is of the same magnitude.

The combination of wires 19 to form the wire arrangement 5 offers several advantages. Provided a given length of the securing area and a given cross-section of the wire arrangement 5, the active securing surface, which determines the adhesive force, is higher when the desired cross-section is built up by several wires. Also, the flexibility of a plurality of wires exceeds that of an individual wire the cross-section of which equals the sum of the cross-sections of the combined wires.

FIGS. 4 and 5 show such a magnetic core element 4 at a scale approximately ten times larger than that of FIG. 2. A housing tube 25, preferably made of a ceramic material, includes seven capillary tubes 26 in symmetrical arrangement, four of them filled with a high-quality, wire-shaped magnetic core material 27. The other three capillary tubes accommodate the wires 19 of the wire arrangement 5. The locations of these three and also of the aforementioned four capillary tubes 26 are preferably provided in symmetrical arrangement in relation to the center of the housing tube 25 so that torsional forces will mutually cancel themselves and the magnetic center of gravity will be located in the center of the wire arrangement 5. The high mutual parallelism of the capillary tubes are most advantageous when both the magnetic core material 27 and the wires 19 fit the capillary tubes 26 as closely as possible. In addition, the wires 19 will rest well against the wall of the capillary tubes 26 if the distance between them at the securing point 21 is kept a little larger or smaller than the distance between the capillary tubes 26. The parallel arrangement of several wires 19 not only results in an elimination of unwanted torsion, but also in a reduction of the slack. To prevent mechanical tensions between the capillary tube 25 and the wires 19, the latter are secured (cemented) to the capillary tube 25 only on one side. To this end, a groove 28 surrounding the tube 25 may be provided which enables the adhesive to be applied from the outside.

In assembling the described differential probe 1, one may proceed substantially as follows: The three wires 19 of the wire arrangement 5 are mounted in the prepared magnetic core elements 4 and in two threaded tubes 15 so that their ends extend a little beyond the threaded tubes 15 when the latter are spaced at the correct distance. The free ends of the wire arrangement 5 are clamped in a simple tensioning device. While maintaining the wire arrangement 5 under a slight tension, the threaded tubes 15 are filled with cast resin. In order to bring the wires 19 at the securing point into the desired position and the correct distance, the magnetic core elements 4 are provisionally pushed near the points 21. When the resin has cured, the magnetic core elements 4 are moved back to their correct location where they are fixed in position by means of an adhesive applied in the groove 28. The assembly consisting of the wire arrangement 5, the magnetic core element 4 and the threaded tubes 15 with their check-nuts 18, is mounted in the probe tube 8. When the caps 9 have been fitted over the ends, the wire arrangement 5 is stretched by means of one of the two tightening nuts 16 until the intended tension is reached. Thereafter, the check-nuts 18 can be tightened to secure the threaded pipes 15.

The parallelism of the magnetic core elements 4 can be easily checked by rotating the vertically suspended probe tube 8 about its axis and observing the indication obtained. In many cases, the existing parallelism will be already sufficient. Otherwise, the parallelism can be corrected simply by rotating the two magnetic core elements 4 about their axes relative to each other until the slight inclinations of their magnetic axis resulting from the inclinations of the individual wires of the magnetic core material 27 coincide. This is done by rotating one of the two threaded tubes 15 about its axis until the variation of the indication caused by an axial rotation of the differential probe 1 is reduced to a minimum. To this end, the bore of one of the two caps 9 is of a design such that it enables the threaded tube 15 to be rotated.

In practice, the magnetic method of balancing maladjustments of the parallelism can be carried out in different ways. For instance, the required small balancing strips may be directly fixed by means of an adhesive to the face of a supporting ring 7. The magnitude of the non-parallelism to be balanced, i.e., the maximum difference in indications during an axial rotation of the differential probe 1, determines the radial distance between the balancing strip and the tube center, while the resulting direction of the adjustment determines the angular position of the balancing strip. Another possibility of carrying out the magnetic method for balancing misadjustments in parallelism consists in that the balancing strips 12 are embedded in small plastic pills 13 (FIG. 6) which are fixed by means of an adhesive to the outside of the probe tube 8. In this case, the axial distance is varied instead of the radial distance in order to balance out the different amounts of non-parallelism.

FIG. 7 shows a magnetic core element 31 consisting essentially of a tube 32 of a soft-magnetic, highly-permeable material. The wire arrangement consists in this case preferably of a single wire 33. The tube 32 is provided with a full-length slot 34 so that it does not constitute a short-circuited turn for the exciting alternating field. No slot 34 is necessary if the magnetic excitation of the core element 32 is achieved by a circular alternating field generated by a current flowing through the wire 33.

FIG. 8 shows another magnetic core element 35, also of cylindrical shape. In this case, the element takes the form of an extremely thin coat 36 of a soft-magnetic highly-permeable material applied upon the wire 33. The coating may be applied by vaporization, for example. The geometry of the magnetic core element 36 achieved by this process is closely adapted to that of the stretched wire 33, so that no balancing of the parallelism will be necessary even if the highest demands are placed on the arrangement.

I claim:

1. A magnetic field differential probe having a housing and two magnetic field sensors each with a magnetic core element having its magnetic axis extending parallel to a predetermined straight line, which magnetic core elements are spaced along said straight line at a prescribed base distance, said sensors being connected to evaluation means for generating an electric signal corresponding to the difference between the magnetic fields existing at the respective locations of the magnetic field sensors, comprising:

a plurality of diamagnetic wires mounted on said probe housing in tension and arranged in a straight line parallel to said predetermined line; and the magnetic core elements are each affixed to said plurality of wires and mutually spaced from one another at said prescribed base distance.

2. A magnetic field differential probe as in claim 1, in which the wire arrangement includes a plurality of wires laterally spaced and parallel to each other.

3. A magnetic field differential probe as in claim 1, in which each magnetic core element includes an elongated body of a diamagnetic material having a plurality of openings extending in parallel to the longitudinal axis of the body, at least one of said openings including wire-shaped magnetic cores, and at least one of said openings including one of the wires of the wire arrangement.

4. A magnetic field differential probe as in claim 3, in which the openings including the magnetic cores and the openings including the wires are arranged symmetrically about the central axis of the elongated body.

5. A magnetic field differential probe as in claim 3, in which both the wires and the magnetic cores closely fit in the openings of the elongated body.

6. A magnetic field differential probe as in either of claims 3 or 4, in which the relative lateral spacing between the wires differs from the lateral spacing between the respective openings of the elongated body accommodating the wires at least at one point.

7. A magnetic field differential probe as in claim 3, in which the elongated body is of cylindrical shape and equipped on one end with a groove extending to the wires passing therethrough and a quantity of adhesive within said groove affixing the body to the wires.

8. A magnetic field differential probe as in claim 1, in which the magnetic core elements are rotatable relative to each other about their longitudinal axes.

9. A magnetic field differential probe as in claim 1, in which an oblong balancing body of a highly-permeable, magnetically soft material, is affixed to the housing and arranged in substantially vertical orientation relative to the magnetic core element axis.

10. A magnetic field differential probe as in claim 1, in which the wire arrangement is fixed at least at one end in a threaded sleeve mounted on the housing and which is adjustable in the axial direction.

11. A magnetic field differential probe as in claim 10, in which the sleeve is secured against rotation.

12. A magnetic field differential probe as in claim 1, in which the magnetic core elements each consists of a small tube of a highly permeable, magnetically soft material.

13. A magnetic field differential probe as in claim 12, in which the tube includes a longitudinally extending slot.

14. A magnetic field differential probe as in claim 1, in which the magnetic core elements consist of a coating of a highly permeable, magnetically soft material formed onto a single wire.

15. A magnetic field differential probe as in claim 12, in which an exciting alternating current flows through the wire arrangement to provide magnetic saturation of the magnetic core element.

16. A magnetic field differential probe as in claim 1, in which the mechanical tension of the wire arrangement is solely the result of its elastic extension.

17. A magnetic field differential probe as in claim 1, in which the base distance is larger than 1 meter.

* * * * *